United States Patent
Tan

(10) Patent No.: US 7,829,364 B2
(45) Date of Patent: Nov. 9, 2010

(54) METHOD OF FABRICATING A SUSPENSION MICROSTRUCTURE

(75) Inventor: Siew-Seong Tan, Hsinchu (TW)

(73) Assignee: MEMSMART Semiconductor Corporation, Hsinchu (TW)

( * ) Notice: Subject to any disclaimer, the term of this patent is extended or adjusted under 35 U.S.C. 154(b) by 148 days.

(21) Appl. No.: 12/243,972

(22) Filed: Oct. 2, 2008

(65) Prior Publication Data

US 2009/0243084 A1 Oct. 1, 2009

(30) Foreign Application Priority Data

Dec. 14, 2007 (TW) .............................. 96148028 A

(51) Int. Cl.
H01L 21/00 (2006.01)
H01L 29/84 (2006.01)
C23F 1/00 (2006.01)

(52) U.S. Cl. .................... 438/51; 438/706; 257/415; 257/E21.218; 257/E21.249; 257/E21.613; 257/E29.324; 216/2; 216/72; 216/79

(58) Field of Classification Search ........................ None
See application file for complete search history.

(56) References Cited

U.S. PATENT DOCUMENTS

| | | | | |
|---|---|---|---|---|
| 6,617,657 | B1 * | 9/2003 | Yao et al. ................. | 257/415 |
| 7,435,612 | B2 * | 10/2008 | Xiao et al. ................ | 438/50 |
| 2004/0227201 | A1 * | 11/2004 | Borwick et al. ........... | 257/414 |
| 2009/0061578 | A1 * | 3/2009 | Tan et al. ................. | 438/200 |
| 2009/0227060 | A1 * | 9/2009 | Tan .......................... | 438/51 |

\* cited by examiner

*Primary Examiner*—Alonzo Chambliss
(74) *Attorney, Agent, or Firm*—Banger Shia

(57) ABSTRACT

A suspension microstructure and its fabrication method, in which the method comprises the steps of: forming at least one insulation layer with inner micro-electro-mechanical structures on an upper surface of a silicon substrate, the micro-electro-mechanical structure includes at least one microstructure and a plurality of metal circuits that are independent from each other, the micro-electro-mechanical structures have an exposed portion on the surface of the insulation layer, and the exposed portion is provided with through holes or stacked metal-via layers correspondingly to the predetermined etching spaces of the micro-electro-mechanical structures, the above predetermined etching spaces and the stacked metal-via layers only penetrate the insulation layer; forming a photoresist with an opening on the upper surface of the exposed portion, and the opening of the photoresist is located outside all the through holes or the stacked metal-via layers; subsequently, conducting etching to realize the suspension of the microstructures.

13 Claims, 7 Drawing Sheets

METHOD OF FABRICATING A SUSPENSION MICROSTRUCTURE

BACKGROUND OF THE INVENTION

1. Field of the Invention

The present invention relates to a method for fabricating a micro-electro-mechanical structure, and more particularly to a suspension microstructure and its fabrication method, which can effectively avoid improper erosion, and further simplify the mask and reduce the package cost.

2. Description of the Prior Art

The existing semiconductor micro-electro-mechanical systems comprises various semiconductor microstructures, such as the unmovable probe, channel, chamber structure, or the movable spring, linkage rod, gear (rigid body movement or flexible deformation), etc.

Integrating the above different structures with the related semiconductor circuit can form various semiconductor applications. Thus, how to utilize the fabricating method to improve the various functions of the microstructure is the key index of the semiconductor electromechanical system in the future and is also a rigorous challenge of further developing the chip in the future.

The existing method for fabricating the micro-electro-mechanical sensor and actuator system is often required to fabricate a suspension structure on a silicon substrate. The above process must adopt the advanced semiconductor technology, such as: wet etching, dry etching and sacrificial layer removing technology, etc.

The wet etching is a fast and effective etching without etching the etchants of other materials. Thus, the wet etching has a quite selectivity according to different materials. However, excluding that the crystallization direction is likely to affect the etching rate, because the chemical reaction doesn't vary in some specific directions, the wet etching is an isotropic etching in essence. The isotropic etching implies that the wet etching can have both the longitudinal etching effect and the transverse etching effect. The transverse etching will cause the undercut problems.

On the contrary, in the dry etching (plasma etching), the plasma is partially-dissociated gas. The greatest advantage of the dry etching is anisotropic etching. However, the selectivity of the dry etching is lower than that of the wet etching (the etching process of the dry etching is generally a physical interaction, so the ion collision can not only remove the etched film, but synchronously remove the photoresist).

The conventional fabrication method of the micro-electromechanical structures must need fabricating a layer of precision mask for restricting the etching, but the mask technology is different from the technology of the deposition of the insulation layer. The precision mask fabrication must apply the complicated technology and equipment (such as exposure machine, optical draft machine) to map the patterns of the masks on the insulation layers of the wafers precisely. Therefore, the recent micro-electro-mechanical structure manufacturers mostly apply another process (or different manufacturer) to fabricate the masks, so that the mask becomes more and more elaborate, thus increasing the manufacturing cost and limiting the dimension and precision of the microstructures.

A first conventional method disclosed in U.S. Pat. No. 6,458,615 B1 is to form at least one insulation layer including inner micro-electro-mechanical structures on an upper surface of a silicon substrate, and then conduct a layer-by-layer etching operation from the upper surface until the lateral edge of the micro-electro-mechanical structure, and finally, conduct an isotropic dry etching to the silicon substrate to realize the suspension of the micro-electro-mechanical structures.

The first conventional method can be used to fabricate a suspension micro-electro-mechanical structure, but it has the following disadvantages:

1. It adopts anisotropic dry chemical etching and uses chemical reaction to remove the isolation layer, however, after the side edge of the micro-electro-mechanical structure is etched, the silicon substrate still needs to be massively etched by isotropic chemical etching, and this technique will produce serious undercut problems;

2. In the process of this conventional technology, the micro-electro-mechanical structure is exposed in the process at first, after a long time of multi-layer processing, the exposed micro-electro-mechanical structure is likely to be contaminated and damaged, causing an excessively low yield rate;

3. The exposure of the metal layer during the process of etching is likely to cause contamination of the chamber of the etching machine by metal and cause unstable etching rate.

With the rapid development of the above technology, in order to improve many problems, a second conventional method disclosed in U.S. Pat. No. 6,712,983 B2 taught the use of a reactive ion etch (hereinafter referred to as RIE) technology. This technology is capable of greatly reducing occurrence of undercut, but since it also conducts a layer-by-layer etching from up down, and the last etching operation of the silicon substrate must apply the transverse etching technology, this improved conventional technology is still complicated and has the undercut problem. It is important that, some problems still have not been improved, such as: the exposure of the micro-electro-mechanical structure and affecting yield rate, etc.

The problem that cannot be solved by the existing technologies is that, a layer of precision mask is still needed for precisely finishing the etching operation, but the micro-electro-mechanical structure has become more and more elaborate, so the fabrication of the mask becomes more and more difficult, thus not only increasing the manufacturing cost, but also causing troubles in transmission, error, cost and particle contamination.

In addition, the shorter the distance between the mask patterns is, the smaller the etching hole will be. The reactant and the ion with energy in the etching system cannot reach and contact the predetermined bottom, or the reaction products cannot be fully discharged out of the hole, thus leading to the reduction of the etching rate. The smaller the etching hole is, the more serious the above phenomena will be, which is the so-called micro loading effect.

The present invention has arisen to mitigate and/or obviate the afore-described disadvantages.

SUMMARY OF THE INVENTION

The primary objective of the present invention is to provide a suspension microstructure and its fabrication method, which can effectively avoid improper erosion and exposure.

In order to achieve the above objective, the suspension structure and its fabrication method in accordance with the present invention are to form at least one insulation layer including inner micro-electro-mechanical structures on an upper surface of a silicon substrate, the micro-electro-mechanical structure includes at least one microstructure and metal circuits that are independent from each other, the micro-electro-mechanical structures have an exposed portion on the surface of the insulation layer, and the exposed portion is provided with through holes or stacked metal-via layers correspondingly to the predetermined etching space of the micro-electro-mechanical structures, the above predetermined etching space or the stacked metal-via layers only extends through the insulation layer.

Hence, the metal material of the respective microstructures cannot be directly exposed in the etching space at all during etching but clad in the insulation layer, thus effectively avoiding the improper erosion and exposure of the micro-electro-mechanical structures.

The secondary objective of the present invention is to provide a suspension microstructure and its fabrication method, which can greatly simplify the precision requirement of the mask and reduce the total cost.

In order to achieve the objective, the present invention is to form at least one insulation layer with inner micro-electro-mechanical structures on an upper surface of a silicon substrate, the micro-electro-mechanical structure includes at least one microstructure and metal circuits that are independent from each other, the micro-electro-mechanical structures have an exposed portion on the surface of the insulation layer, and the exposed portion is provided with through holes or stacked metal-via layers correspondingly to the predetermined space of the micro-electro-mechanical structures, in addition, a photoresist with an opening is formed on the upper surface of the insulation layer, and the opening of the photoresist is located outside the through holes or the stacked metal-via layers of the exposed portion.

Hence, the exposed portion of the present invention can be directly formed by deposition during the deposition of multi-layer micro-electro-mechanical structures, and the exposed portion utilizes the through holes or the stacked metal-via layers to replace the precision mask during etching, and it only needs to cooperate the opening of the simplified mask with the sequent etching to realize the suspension of the microstructures of the micro-electro-mechanical structures.

Particularly, the exposed portion can be removed at any moment to reduce the micro loading effect and prevent the machine chamber from being contaminated by metal.

Hence, the present invention can simplify the mask, reduce the precision requirements of the mask and further lower the cost.

It is to be noted that, the metal material in the microstructures of the present invention is clad in the insulation layer, so that the present invention can exert the same effect no matter in the bottom-up etching or the top-down etching.

In addition, the opening of the simplified mask only covers the periphery of the through holes or the stacked metal-via layers of the exposed portion and located outside the through holes or the stacked metal-via layers of the exposed portion, so that the photoresist of the present invention is impossible to affect the circuit package design, and it can be selectively removed or remained according to the requirements.

For the same reason, since the photoresist can be removed or remained, the photoresist of the present invention can be also made of different materials according to the requirements without being limited to a fixed material.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
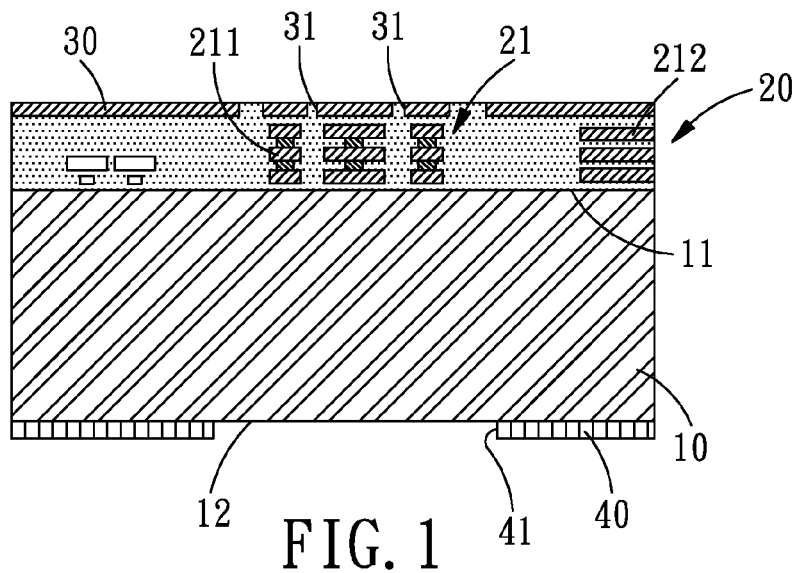
FIG. 1 is a cross sectional view showing a first step of a method for fabricating a suspension microstructure in accordance with a first embodiment of the present invention.

Referring to FIGS. 1-7, a suspension microstructure and its fabrication method in accordance with a first embodiment of the present invention are illustrated in detail as follows:

As shown in FIG. 1, an insulation layer 20 including inner micro-electro-mechanical structures 21 is formed on an upper surface 11 of a silicon substrate 10 first. The micro-electro-mechanical structure 21 includes at least one microstructure 211 and a plurality of metal circuits 212 that are independent from each other. The micro-electro-mechanical structures 21 have an exposed portion 30 on the surface of the insulation layer 20, and the exposed portion 30 is provided with plural through holes 31 correspondingly to the predetermined etching spaces of the micro-electro-mechanical structures 21. The predetermined etching spaces only penetrate the insulation layer 20 without contacting the micro-electro-mechanical structures 21. A barrier layer 40 with an opening 41 is formed on the lower surface of the silicon substrate 40, and the opening 41 is located correspondingly to the microstructures 211.

Figure 2:
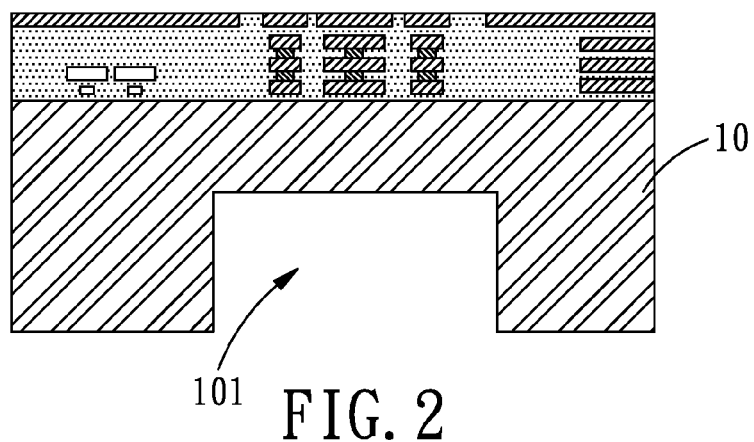
FIG. 2 is a cross sectional view showing a second step of the method for fabricating a suspension microstructure in accordance with the first embodiment of the present invention.

As shown in FIG. 2, a deep reactive ion etching (DRIE) is subsequently conducted from the opening 41 of the barrier layer 40 to etch a space 101 in the silicon substrate 10 quickly, and then the barrier layer 40 is removed.

Figure 3:
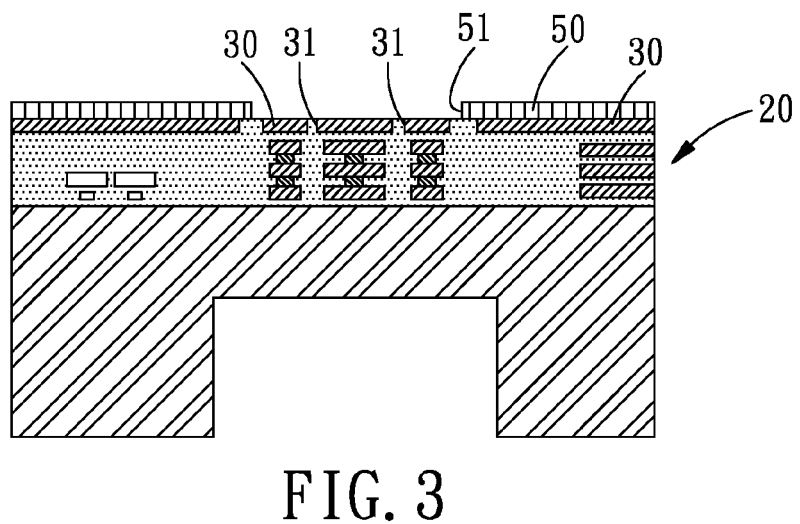
FIG. 3 is a cross sectional view showing a third step of the method for fabricating a suspension microstructure in accordance with the first embodiment of the present invention.

As shown in FIG. 3, a photoresist 50 with an opening 51 is formed on the upper surface of the insulation layer 20 and the exposed portion 30. The opening 51 is located outside all the through holes 31 of the exposed portions 30.

Figure 4:
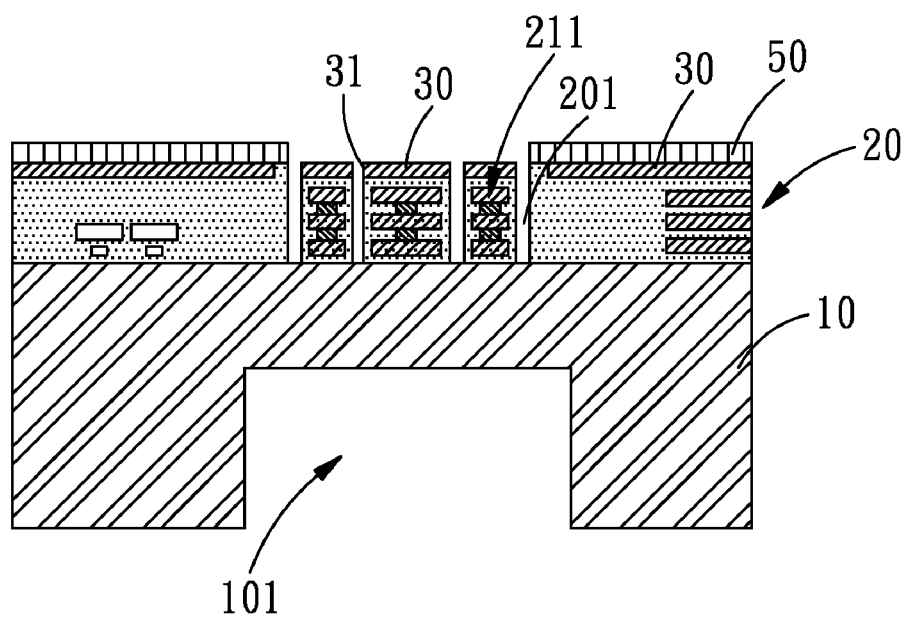
FIG. 4 is a cross sectional view showing a fourth step of the method for fabricating a suspension microstructure in accordance with the first embodiment of the present invention.

As shown in FIG. 4, a reactive ion etching (RIE) is subsequently conducted downwards from the through holes 31 of the exposed portion 30. The insulation layer 20 will be interiorly formed with etching spaces 201. The etching spaces 201 only penetrate the insulation layer 20 without contacting the micro-electro-mechanical structures 21, so the micro-electro-mechanical structures 21 are clad in the insulation layer 20 in such a manner that the microstructures 211 and the metal circuits 212 in the micro-electro-mechanical structures 21 cannot be exposed at all.

Figure 5:
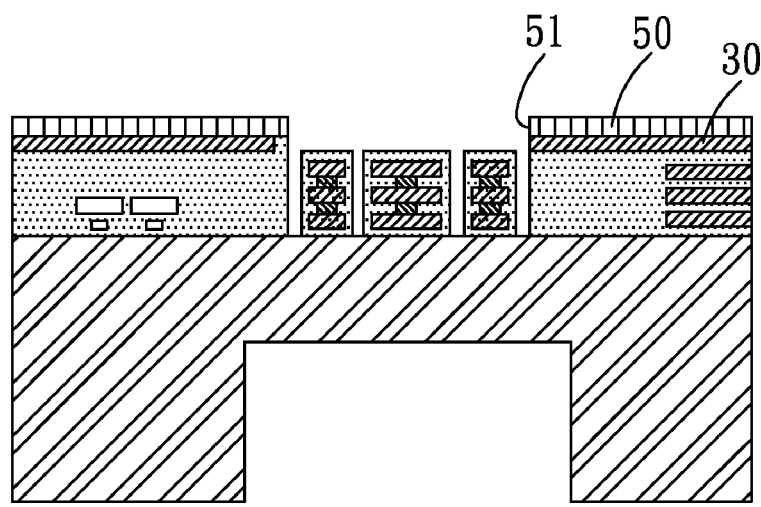
FIG. 5 is a cross sectional view showing a fifth step of the method for fabricating a suspension microstructure in accordance with the first embodiment of the present invention.

As shown in FIG. 5, the part of the exposed portion 30 within the opening 51 of the photoresist 50 is removed by etching (wet or dry), so as to prevent the deep reactive ion etching (DRIE) machine chamber from being contaminated by the metal material.

Figure 6:
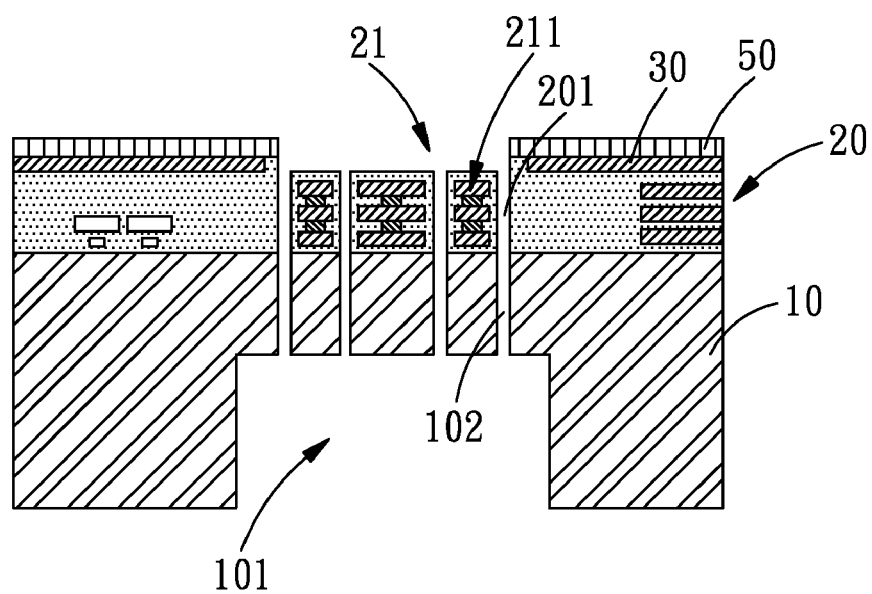
FIG. 6 is a cross sectional view showing a sixth step of the method for fabricating a suspension microstructure in accordance with the first embodiment of the present invention.

As shown in FIG. 6, a deep reactive ion etching (DRIE) is conducted from the etching spaces 201 to the space 101 in the silicon substrate 10 to form through spaces 102. The etching spaces 201, the through spaces 102 and the space 101 communicate with one another to realize the suspension of the microstructures 211 of the micro-electro-mechanical structures 21.

Figure 7:
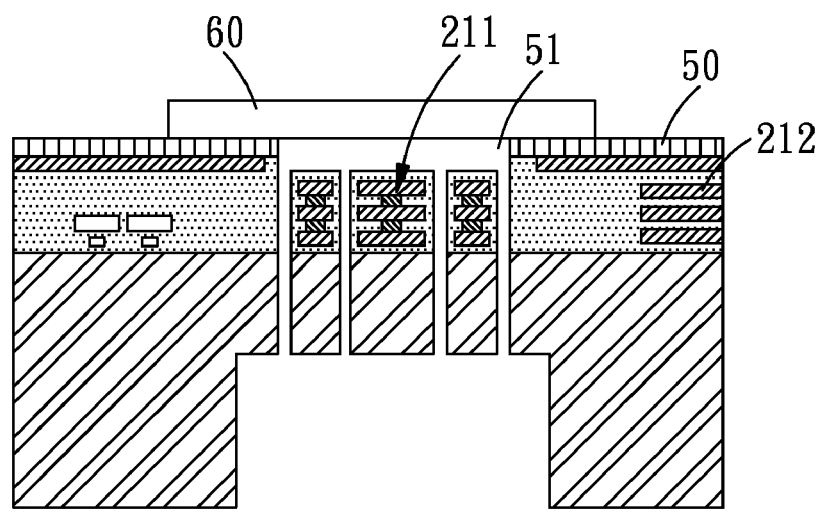
FIG. 7 is a cross sectional view showing a seventh step of the method for fabricating a suspension microstructure in accordance with the first embodiment of the present invention.

Ultimately, as shown in FIG. 7, a protective cap 60 (for example, glass) is covered outside the opening 51 of the photoresist 50 to seal the suspension microstructures 211.

The suspension microstructures and its fabrication method in accordance with the first embodiment of the present invention have the following advantages:

1. Reducing the exposure of the micro-electro-mechanical structure, reducing the damage probability, and effectively avoiding undercut: the micro-electro-mechanical structures 21 are clad in the insulation layer 20 in such a manner that the microstructures 211 and the metal circuits 212 in the micro-electro-mechanical structures 21 cannot be exposed at all, so that the present invention can avoid the damage caused during etching and the exposure of the micro-electro-mechanical structures 21, thus effectively increasing the yield rate of the products;

2. The micro-electro-mechanical structures 21 include an exposed portion 30 on the surface of the insulation layer 20, and the exposed portion 30 is provided with through holes 31 correspondingly to the predetermined etching spaces between the micro-electro-mechanical structures 21 and can be directly formed by deposition, the exposed portion 30 substitutes for the precision mask during etching, and it only needs to cooperate the opening 51 of the simplified photoresist 50 with the sequent etching, the suspension of the microstructures 211 can be realized, so that the fabrication complexity is reduced and the production efficiency is increased, thus reducing the cost and improving competitiveness.

Figure 8:
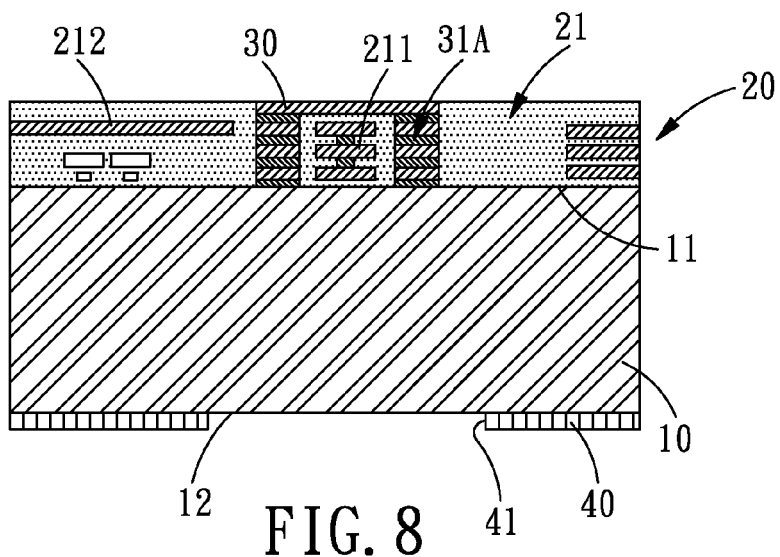
FIG. 8 is a cross sectional view showing a first step of a method for fabricating a suspension microstructure in accordance with a second embodiment of the present invention.

Referring to FIGS. 8-12, a suspension microstructure in accordance with a second embodiment of the present invention is slightly different (the stacked metal-via layers replace the through holes) from the first embodiment, and a method for fabricating a suspension microstructure for a compatible integrated circuit in accordance with the second embodiment of the present invention is illustrated as follows:

As shown in FIG. 8, an insulation layer 20 with inner micro-electro-mechanical structures 21 is formed on an upper surface 11 of a silicon substrate 10 first. The micro-electro-mechanical structure 21 includes at least one microstructure 211 and a plurality of metal circuits 212 that are independent from each other. Under the exposed portion 30 is provided a plurality of mutually-conducted stacked metal-via layers 31A correspondingly to the predetermined etching spaces. The stacked metal-via layers 31A reach the upper surface 11 of the silicon substrate 10 and only penetrate the insulation layer 20 without contacting the micro-electro-mechanical structures 21. A barrier layer 40 with an opening 41 is formed on the lower surface 12 of the silicon substrate 10, and the opening 41 is located correspondingly to the microstructures 211.

Figure 9:
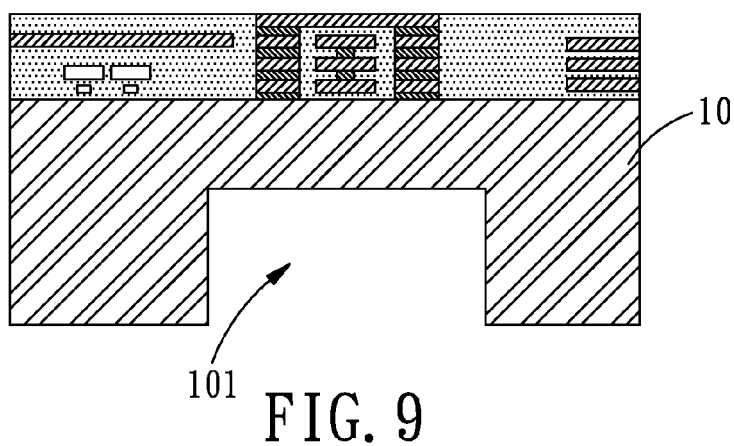
FIG. 9 is a cross sectional view showing a second step of the method for fabricating a suspension microstructure in accordance with the second embodiment of the present invention.

Next, as shown in FIG. 9, a deep reactive ion etching (DRIE) is conducted from the opening 41 of the barrier layer 40 to etch a space 101 in the silicon substrate 10 quickly, and then the barrier layer 40 is removed.

Figure 10:
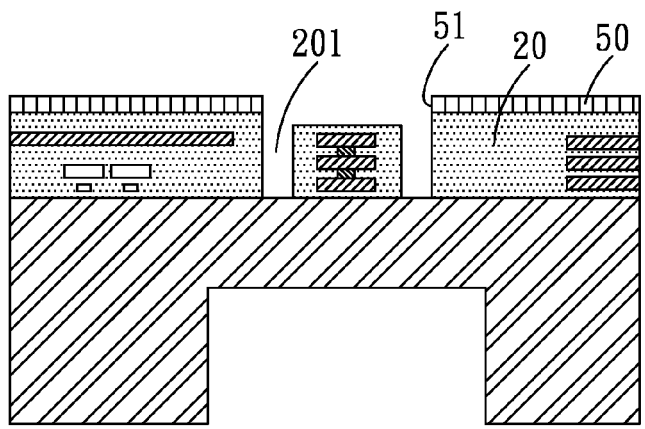
FIG. 10 is a cross sectional view showing a third step of the method for fabricating a suspension microstructure in accordance with the second embodiment of the present invention.

Subsequently, as shown in FIG. 10, a photoresist 50 with an opening 51 is formed on the upper surface of the insulation layer 20, and the opening 51 is located outside all the stacked metal-via layers 31A of the exposed portion 30, the exposed portion 30 and all the stacked metal-via layers 31A are removed by etching (wet or dry) in order to form etching spaces 201, which only penetrate the insulation layer 20, so the micro-electro-mechanical structures 21 are clad in the insulation layer 20 in such a manner that the microstructures 211 and the metal circuits 212 in the micro-electro-mechanical structures 21 cannot be exposed at all.

Figure 11:
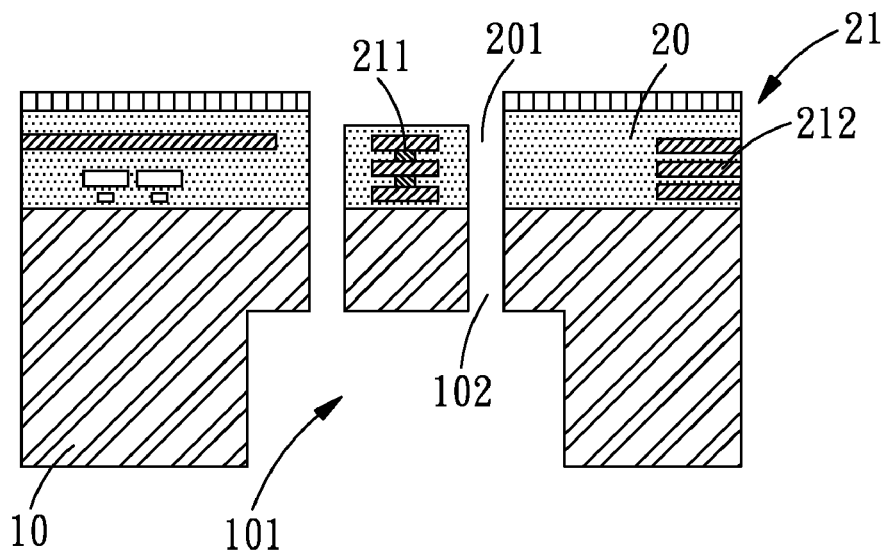
FIG. 11 is a cross sectional view showing a fourth step of the method for fabricating a suspension microstructure in accordance with the second embodiment of the present invention.

As shown in FIG. 11, a deep reactive ion etching (DRIE) is conducted from the etching spaces 201 to the space 101 in the silicon substrate 10 to form through spaces 102, the etching spaces 210, the through spaces 102 and the space 101 communicate with one another to realize the suspension of the microstructures 211 of the micro-electro-mechanical structures 21.

Figure 12:
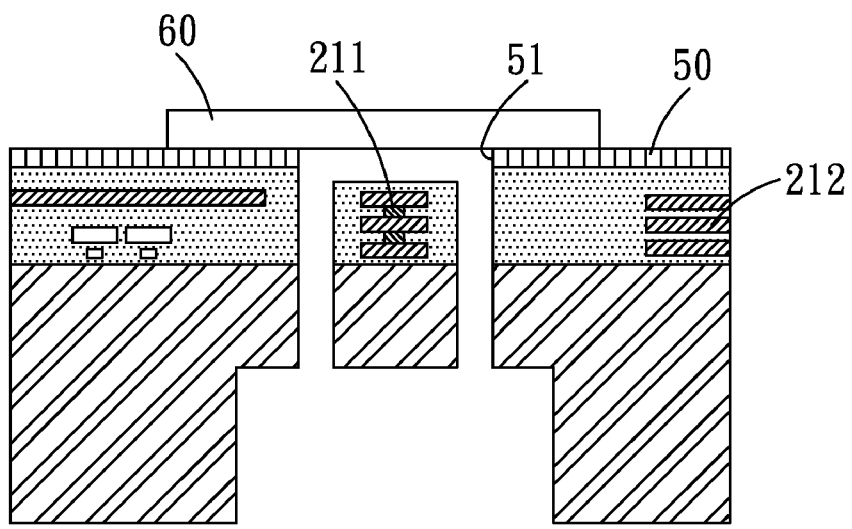
FIG. 12 is a cross sectional view showing a fifth step of the method for fabricating a suspension microstructure in accordance with the second embodiment of the present invention.

Ultimately, as shown in FIG. 12, a protective cap 60 (for example, glass) is covered outside the opening 51 of the photoresist 50 to seal the suspension microstructures 211.

The present embodiment in accordance with the present invention is characterized in that: under the exposed portion 30 is provided a plurality of mutually-conducted stacked metal-via layers 31A, which reach the upper surface 11 of the silicon substrate 10, and these stacked metal-via layers 31A replace the through holes in the first embodiment in accordance with the present invention.

Hence, the suspension microstructures and its fabrication method in accordance with the second embodiment have the following advantages:

1. Reducing the exposure of the micro-electro-mechanical structure, reducing the probability of damage, and effectively avoiding undercut (as described previously);

2. The exposed portion 30 and the stacked metal-via layers 31A are directly formed by deposition, so as to substitute for the precision mask effectively during etching, and it only needs to cooperate the opening 51 of the simplified photoresist 50 with the sequent etching to realize the suspension of the microstructures 211, so that the fabrication complexity is reduced and the production efficiency is increased, thus reducing the cost and improving competitiveness.

Figure 13:
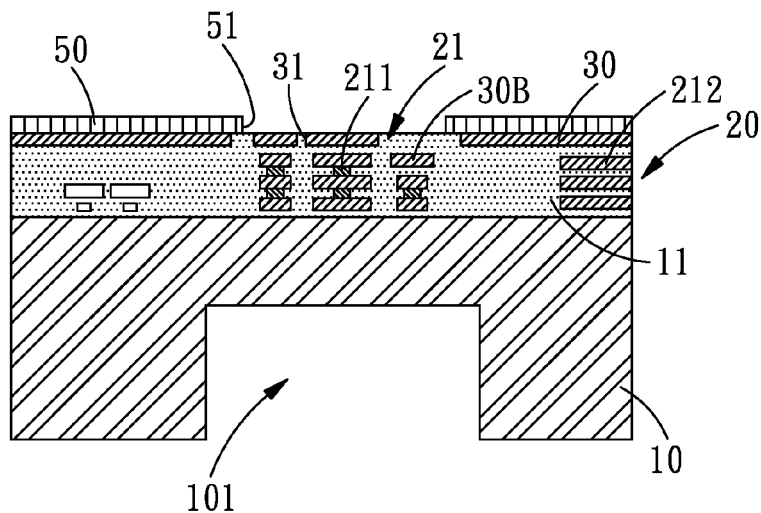
FIG. 13 is a cross sectional view showing a first step of a method for fabricating a suspension microstructure in accordance with a third embodiment of the present invention.

Referring to FIGS. 13-18, the suspension microstructure for a compatible integrated circuit in accordance with a second embodiment of the present invention is slightly different (through holes cooperate with an exposed portion and an embedded portion that are located in different depths), and a method for fabricating a suspension microstructure for a compatible integrated circuit in accordance with the third embodiment of the present invention is illustrated as follows:

As shown in FIG. 13, an insulation layer 20 with inner micro-electro-mechanical structures 21 is formed on an upper surface 11 of a silicon substrate 10 first. The micro-electro-mechanical structure 21 includes at least one microstructure 211 and a plurality of metal circuits 212 that are independent from each other. Moreover, the micro-electro-mechanical structures 21 have an exposed portion 30 and an embedded portion 30B. The exposed portion 30 is provided with through holes 31 correspondingly to the predetermined etching spaces of the micro-electro-mechanical structures 21. The embedded portion 30B is lower than the exposed portion 30 and located in the predetermined etching space of the through holes 31, which only penetrates the insulation layer without contacting the micro-electro-mechanical structures 21. A space 101 is further formed in the silicon substrate 10 (the same technical details are omitted). A photoresist 50 with an opening 51 is formed on the upper surface of the insulation layer 20 and the exposed portion 30, and the opening 51 is located outside all the through holes 31 of the exposed portions 30.

Figure 14:
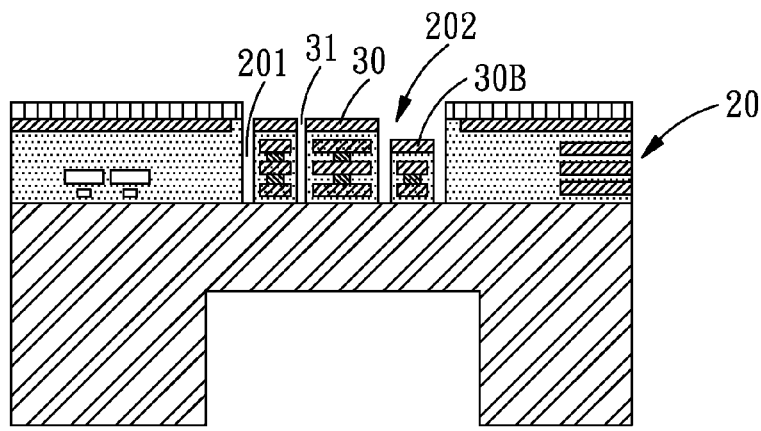
FIG. 14 is a cross sectional view showing a second step of the method for fabricating a suspension microstructure in accordance with the third embodiment of the present invention.

Next, as shown in FIG. 14, a reactive ion etching (RIE) is conducted downwards from the through holes 31 of the exposed portion 30 to form etching spaces 201, since the embedded portion 30B is lower than the exposed portion 30 and located in the predetermined etching space of the through holes 31, a sunken space 202 is etched above the embedded portion 30B of the present embodiment in accordance with the present invention. The etching spaces 201 and the sunken space 202 only penetrate the insulation layer 20 without contacting the micro-electro-mechanical structures 21, so the micro-electro-mechanical structures 21 are clad in the insulation layer 20 in such a manner that the microstructures 211 and the metal circuits 212 in the micro-electro-mechanical structures 21 cannot be exposed at all.

Figure 15:
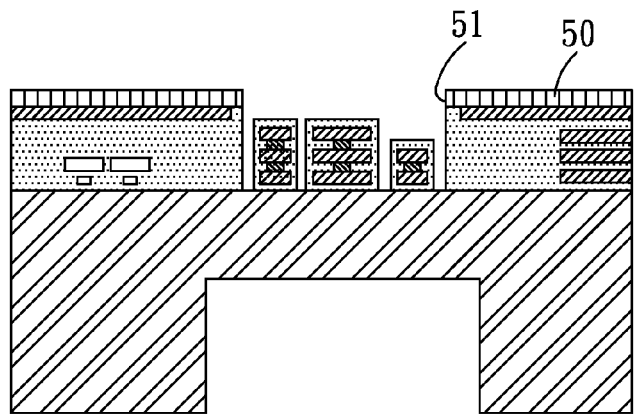
FIG. 15 is a cross sectional view showing a third step of the method for fabricating a suspension microstructure in accordance with the third embodiment of the present invention.

Subsequently, as shown in FIG. 15, the part of the exposed portion 30 within the opening 51 of the photoresist 50 and the embedded portion 30B are removed by etching (wet or dry), thus preventing the deep reactive ion etching (DRIE) machine chamber from being contaminated by the metal material.

Figure 16:
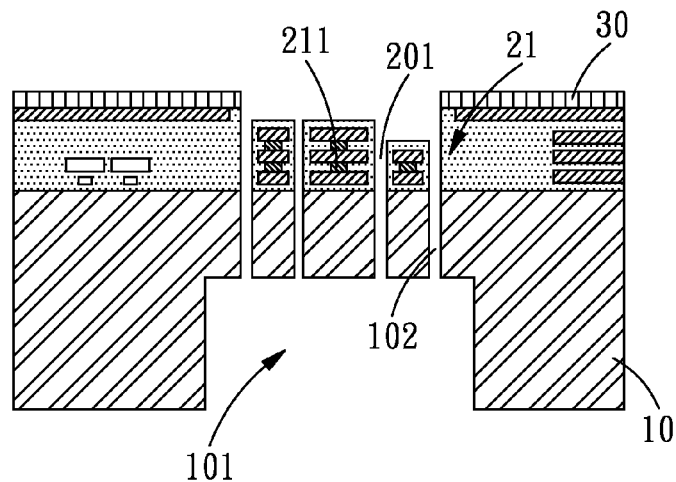
FIG. 16 is a cross sectional view showing a fourth step of the method for fabricating a suspension microstructure in accordance with the third embodiment of the present invention.

As shown in FIG. 16, a deep reactive ion etching (DRIE) is conducted from the etching space 201 to the space 101 in the silicon substrate 10 to form a through space 102, the etching space 201, the through space 102 and the space 101 communicate with one another to realize the suspension of the microstructures 211.

Figure 17:
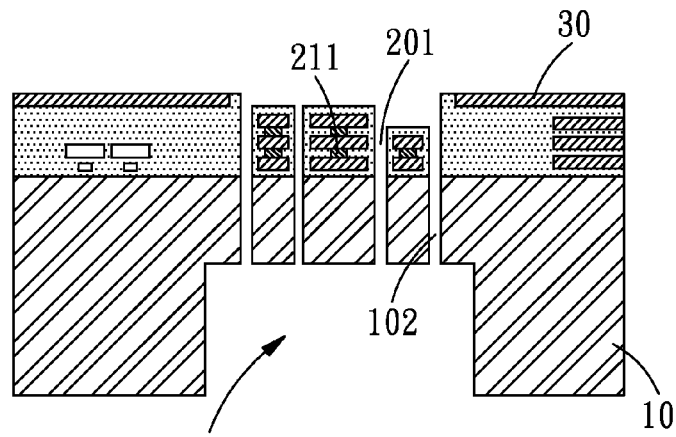
FIG. 17 is a cross sectional view showing a fifth step of the method for fabricating a suspension microstructure in accordance with the third embodiment of the present invention.

As shown in FIG. 17, the photoresist 50 on the upper surface of the exposed portion 30 is subsequently removed.

Figure 18:
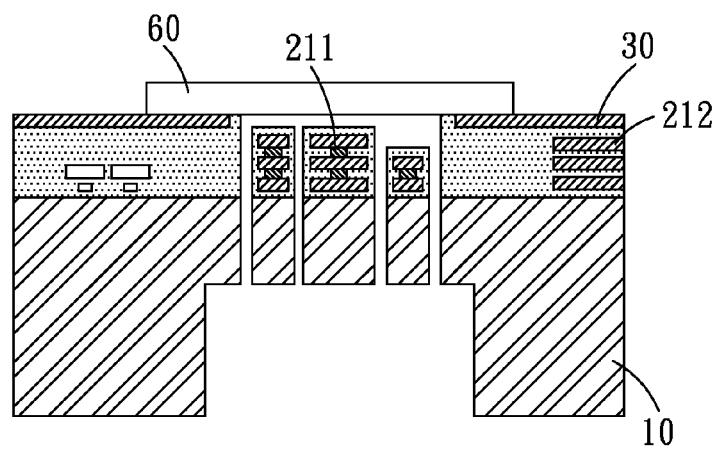
FIG. 18 is a cross sectional view showing a sixth step of the method for fabricating a suspension microstructure in accordance with the third embodiment of the present invention.

Ultimately, as shown in FIG. 18, a protective cap 60 is covered outside the exposed portion 30 to seal the suspension microstructures 211 while the metal circuits 212 and the exposed portion 30 are partially exposed to act as a plating substrate which is directly electrically conducted via a standard chip structure for circuit connection.

The suspension microstructures and its fabrication method in accordance with the third embodiment have the following advantages:

1. Reducing the exposure of the micro-electro-mechanical structure, reducing the probability of damage, and effectively avoiding undercut (as described previously);

2. The exposed portion 30 and the embedded portion 30B can be directly formed by deposition, so as to replace the precision mask during etching effectively, and it only needs to cooperate the opening 51 of the simplified photoresist 50 with the sequent etching to realize the suspension of the microstructures 211, so that the fabrication complexity is reduced and the production efficiency is increased, thus reducing the cost and improving competitiveness;

3. The sunken space 202 above the embedded portion 30B can effectively increase the configuration variation of the future circuit application in accordance with the present invention.

To summarize, the creative feature of the present invention is that, at least one insulation layer including inner micro-electro-mechanical structures is formed on an upper surface of a silicon substrate, the micro-electro-mechanical structure includes at least one microstructure and a plurality of metal circuits that are independent from each other, moreover, the micro-electro-mechanical structures have an exposed portion on the surface of the insulation layer, and the exposed portion is provided with through holes or stacked metal-via layers correspondingly to the predetermined etching spaces of the micro-electro-mechanical structures, the above etching spaces and the stacked metal-via layers only penetrate the insulation layer, in addition, a photoresist with an opening is formed on the upper surface of the exposed portion, and the opening of the photoresist is located outside all the through holes or the stacked metal-via layers of the exposed portion, next etching is successively conducted in order to realize the suspension of the microstructures.

By such arrangements, the present invention can effectively avoid improper erosion, and further simplify the mask and reduce the package cost.

While we have shown and described various embodiments in accordance with the present invention, it is clear to those skilled in the art that further embodiments may be made without departing from the scope of the present invention.

What is claimed is:

1. A method for fabricating a suspension microstructure comprising the steps of:

forming an insulation layer including inner micro-electro-mechanical structures on an upper surface of a silicon substrate, the micro-electro-mechanical structure including at least one microstructure and a plurality of metal circuits that are independent from each other, the micro-electro-mechanical structures having an exposed portion on a surface of the insulation layer, the exposed portion being provided with through holes correspondingly to predetermined etching spaces of the micro-electro-mechanical structures, which only penetrates the insulation layer without contacting the micro-electro-mechanical structures;

next, forming a photoresist with an opening on the insulation layer, the opening of the photoresist being located outside the through holes of the exposed portion;

subsequently, conducting an etching from the through holes of the exposed portion downwards to form etching spaces which only penetrate the insulation layer, the microstructures of the micro-electro-mechanical structures being clad in the insulation layer; and realizing suspension of the microstructures by etching.

2. The method for fabricating a suspension microstructure as claimed in claim 1 further comprising the steps of:
forming a barrier layer with an opening on a lower surface of the silicon substrate, the opening of the barrier layer being located correspondingly to the microstructures of the micro-electro-mechanical structures;
subsequently, conducting a deep reactive ion etching from the opening of the barrier layer and quickly etching a space in the silicon substrate; and
removing the barrier layer.

3. The method for fabricating a suspension microstructure as claimed in claim 1 further comprising the step of: removing a part of the exposed portion within the opening of the photoresist by etching.

4. The method for fabricating a suspension microstructure as claimed in claim 3, wherein the step of realizing suspension of the microstructures by etching further comprises:
conducting a deep reactive ion etching from the etching spaces to the space in the silicon substrate to form through spaces, the respective spaces connect with each other to realize the suspension of the microstructures of the micro-electro-mechanical structures.

5. The method for fabricating a suspension microstructure as claimed in claim 1 further comprising removing the photoresist in the step of realizing suspension of the microstructures by etching.

6. A method for fabricating a suspension microstructure comprising the steps of:
forming an insulation layer including inner micro-electro-mechanical structures on an upper surface of a silicon substrate, the micro-electro-mechanical structure including at least one independent microstructure, the micro-electro-mechanical structures having an exposed portion on a surface of the insulation layer, under the exposed portion being provided a plurality of mutually-conducted stacked metal-via layers correspondingly to predetermined etching spaces, the stacked metal-via layers reaching the upper surface of the silicon substrate and only penetrating the insulation layer without contacting the micro-electro-mechanical structures;
next, forming a photoresist with an opening on the insulation layer, the opening of the photoresist being located outside the exposed portion;
subsequently, removing the exposed portion and all the stacked metal-via layers by etching to form etching spaces only penetrating the insulation layer; and
conducting an etching from the etching spaces downwards to realize suspension of the microstructures.

7. The method for fabricating a suspension microstructure as claimed in claim 6 further comprising the steps of:
forming a barrier layer with an opening on a lower surface of the silicon substrate, the opening of the barrier layer being located correspondingly to the microstructures of the micro-electro-mechanical structures;
subsequently, conducting a deep reactive ion etching from the opening of the barrier layer and quickly etching a space in the silicon substrate; and
removing the barrier layer.

8. The method for fabricating a suspension microstructure as claimed in claim 6 further comprising removing the photoresist in the step of conducting the etching downwards to realize suspension of the microstructures.

9. The method for fabricating a suspension microstructure as claimed in claim 6 further comprising in the step of conducting the etching downwards to realize suspension of the microstructures: conducting a deep reactive ion etching from the etching spaces to the space in the silicon substrate to form through spaces, the respective spaces connect with each other to realize the suspension of the microstructures of the micro-electro-mechanical structures.

10. A method for fabricating a suspension microstructure comprising the steps of:
forming an insulation layer including inner micro-electro-mechanical structures on an upper surface of a silicon substrate, the micro-electro-mechanical structure including at least one microstructure and a plurality of metal circuits that are independent from each other, the micro-electro-mechanical structures having an exposed portion and an embedded portion, the exposed portion being provided with through holes correspondingly to predetermined etching spaces of the micro-electro-mechanical structures, the embedded portion being lower than the exposed portion and located in a predetermined etching space of the through holes, which only penetrates the insulation layer without contacting the micro-electro-mechanical structures;
next, forming a photoresist with an opening on the insulation layer, the opening of the photoresist being located outside all the through holes of the exposed portion;
subsequently, conducting an etching from the through holes of the exposed portion downwards to etch etching spaces in the insulation layer, the embedded portion is lower than the exposed portion and located in the predetermined etching space of the through holes, so that a sunken space is etched above the embedded portion, the etching spaces and the sunken space only penetrate the insulation layer without contacting the micro-electro-mechanical structures;
removing a part of the exposed portion within the opening of the photoresist and the exposed embedded portion; and
etching a predetermined space toward the silicon substrate to realize suspension of the microstructures of micro-electro-mechanical structures.

11. The method for fabricating a suspension microstructure as claimed in claim 10 further comprising the steps of:
forming a space in the silicon substrate;
next, conducting a dry reactive ion etching (RIE) from the through holes of the exposed portion downwards;
removing the exposed portion and the embedded portion by etching; and
conducting a deep reactive ion etching from the etching space toward the space in the silicon substrate.

12. The method for fabricating a suspension microstructure as claimed in claim 10 further comprising the steps of:
forming a barrier layer with an opening on a lower surface of the silicon substrate, the opening of the barrier layer being located correspondingly to the microstructures of the micro-electro-mechanical structures;
subsequently, conducting a deep reactive ion etching from the opening of the barrier layer and quickly etching the space in the silicon substrate; and
removing the barrier layer.

13. The method for fabricating a suspension microstructure as claimed in claim 10 further comprising the step of: covering a protective cap outside the opening of the photoresist.

* * * * *